United States Patent [19]

Hida et al.

[11] Patent Number: 4,727,403
[45] Date of Patent: Feb. 23, 1988

[54] DOUBLE HETEROJUNCTION SEMICONDUCTOR DEVICE WITH INJECTOR

[75] Inventors: Hikaru Hida; Keiichi Ohata, both of Tokyo, Japan

[73] Assignee: NEC Corporation, Tokyo, Japan

[21] Appl. No.: 849,336

[22] Filed: Apr. 8, 1986

[30] Foreign Application Priority Data

Apr. 8, 1985 [JP] Japan .................................. 60-73943

[51] Int. Cl.$^4$ ............................................. H01L 29/80
[52] U.S. Cl. ...................................... 357/22; 357/16; 357/58
[58] Field of Search ................. 357/22 A, 22 MD, 58, 357/16

[56] References Cited

U.S. PATENT DOCUMENTS

| | | | |
|---|---|---|---|
| 4,194,935 | 3/1980 | Dingle et al. ...................... | 357/22 A |
| 4,538,165 | 8/1985 | Chang et al. ...................... | 357/22 A |
| 4,558,337 | 12/1985 | Saunier et al. ..................... | 357/22 A |
| 4,590,502 | 5/1986 | Morkoc ................................ | 357/16 |
| 4,593,301 | 6/1986 | Inata et al. ............................ | 357/16 |
| 4,605,945 | 12/1986 | Katayama et al. ................ | 357/22 A |

FOREIGN PATENT DOCUMENTS

| | | | |
|---|---|---|---|
| 92645 | 11/1983 | European Pat. Off. .......... | 357/22 A |
| 59-111371 | 6/1984 | Japan ............................. | 357/22 MD |

OTHER PUBLICATIONS

S. Luryi, "An Induced Base Hot-Electron Transistor," IEEE Elec. Dev. Lett., vol. EDL-6, #4, Apr. 1985, pp. 178-180.

Primary Examiner—Joseph E. Clawson, Jr.
Attorney, Agent, or Firm—Sughrue, Mion, Zinn, Macpeak & Seas

[57] ABSTRACT

A semiconductor device including a first semiconductor layer having a low carrier density, a second semiconductor layer on the first semiconductor layer and having a low carrier density, a third semiconductor layer on the second semiconductor layer, a fourth semiconductor layer on the third semiconductor layer and effective to inject holes into the second semiconductor layer through the third semiconductor layer for inducing a channel of, for example, electrons in the second semiconductor layer in proximity to and along the interface between the second and third semiconductor layers, and a pair of ohmic contact regions extending through the second and third semiconductor layers for providing ohmic contact with the second semiconductor layer for permitting modulation of the conductance between the ohmic contact regions when holes, for example, are injected from the fourth semiconductor layer into the second semiconductor layer. The device has double heterojunctions, one between the first and second semiconductor layers and the other between the second and third semiconductor layers, thus providing FET mode and bipolar mode of operation.

11 Claims, 7 Drawing Figures

DOUBLE HETEROJUNCTION SEMICONDUCTOR DEVICE WITH INJECTOR

FIELD OF THE INVENTION

The present invention relates to a semiconductor device and, more particularly, to a double-heterojunction semiconductor device providing superhigh-frequency oscillation performance and/or optoelectronic performance.

BACKGROUND OF THE INVENTION

Growing research and development efforts are being made for semiconductor integrated circuits composed of field-effect transistors (hereinafter referred to as FETs) using compound semiconductor materials such as gallium arsenide (hereinafter referred to as GaAs) and aluminum-gallium arsenide (hereinafter referred to as AlGaAs). Typical of such compound semiconductor devices are GaAs Schottky gate transistors and selectively doped AlGaAs/GaAs devices. These heterojunction devices exhibit electron mobilities several times higher than those achievable by presently known silicon devices and have been expected to contribute to realizing faster semiconductor integrated circuits.

The fact is however that such GaAs and/or AlGaAs devices are, at least at the present stage of development, not satisfactory for achieving such high switching speeds that have been expected to be achievable by GaAs/AlGaAs devices. The inability of GaAs/AlGaAs devices to provide high switching speeds is pronounced especially at the LSI level and is attributable to the inadequate current driving capacity of the devices. Therefore, attempts are being made to realize semiconductor integrated circuits composed of bipolar transistors using GaAs or various combinations of GaAs and AlGaAs. Typical of such bipolar transistors is a heterojunction bipolar transistor (HBT), especially a wide band gap emitter HBT having an emitter region which is wider in band gap than the base region of the transistor. A prototype device of this kind of HBT will be the wide band gap emitter transistor disclosed by P. M. Asbeck et al in "(Ga,As)As/GaAs Bipolar Transistors for Digital Integrated Circuits", IEDM Tech. Digest 1981, 629–632. The HBT therein taught uses AlGaAs for the emitter and appears to be predominant over much of the current research and development efforts being made for HBTs.

However, most of presently known HBTs persistently have various problems to be solved. Among these problems is the complexity in the device configuration and in the process of device fabrication. The large collector-base capacitances and the limited operation speeds of such devices are also important ones of the problems to be solved.

An advanced semiconductor device is proposed in presently co-pending U.S. patent application Ser. No. 807,935 in which holes are injected into an active layer of undoped GaAs from a hole injector layer of p+-type to induce a channel of electrons similar in effect to the two-dimensional electron gas layer formed in a known high electron mobility transistor (HEMT). The electrons induced in the active layer of the semiconductor device therein disclosed are trapped in the layer solely with the aid of the potential barrier intervening between the active layer and the hole injector layer and for this reason could not be reliably confined within the electron channel created in the active layer.

SUMMARY OF THE INVENTION

In accordance with the present invention, there is provided a semiconductor device comprising (a) a first semiconductor layer having a low carrier density, (b) a second semiconductor layer formed on the first semiconductor layer and having a low carrier density, the second semiconductor layer being smaller in the sum of electron affinity and energy band gap than the first semiconductor layer and forming a heterojunction with the first and second semiconductor layers, (c) a third semiconductor layer formed on the second semiconductor layer and smaller in electron affinity than the second semiconductor layer and forming a heterojunction with the second and third semiconductor layers, (d) a fourth semiconductor layer formed on the third semiconductor layer and effective to inject carriers of one type into the second semiconductor layer through the third semiconductor layer for inducing a channel of carriers of another type in the second semiconductor layer in proximity to and along the interface between the second and third semiconductor layers, and (e) a pair of ohmic contact regions extending through the second and third semiconductor layers for providing ohmic contact at least with the second semiconductor layer for permitting modulation of the conductance between the ohmic contact regions when carriers of the aforesaid one type are injected from the fourth semiconductor layer into the second semiconductor layer.

The fourth semiconductor layer may be doped with an acceptor-type dopant for injecting holes into the second semiconductor layer through the third semiconductor layer for inducing a channel of electrons in the second semiconductor layer. Alternatively, the fourth semiconductor layer may be doped with a donor-type dopant for injecting electrons into the second semiconductor layer through the third semiconductor layer for inducing a channel of holes in the second semiconductor layer. On the other hand, the third semiconductor layer preferably has a substantially zero carrier density and doped with a donor-type dopant.

In a device thus constructed, the first semiconductor layer forms heterojunction at its interface with the second semiconductor layer to provide a potential barrier to holes or electrons. If the fourth semiconductor layer is doped with an acceptor-type dopant, holes are to be injected into the second semiconductor layer so that electrons are induced in the second semiconductor layer in an attempt to recover charge neutrality in the layer. In this instance, the heterojunction at the interface between the first and second semiconductor layers provides a potential barrier to holes and blocks the possible transfer of holes from the second semiconductor layer into the first semiconductor layer. The potential barrier is thus effective to form a layer of holes accumulated in the second semiconductor layer which forms a potential well for holes between the first and second layers. This layer of the holes accumulated in the second semiconductor layer suppresses the scattering of the electrons in the electron channel region formed in the second semiconductor layer and facilitates trapping of electrons within a triangular or notch-shaped electron confinement well formed between the two layers in the conduction band of the device. This will improve the two-dimensional mobility performance of electrons in the channel region and will, accordingly, assure high-velocity transport of electrons through the channel region, providing a low drain conductance and a large current driving capacity. This is one of the outstanding features of a semiconductor device according to the present invention which can not be achieved in a device disclosed in the previously named co-pending U.S. patent application Ser. No. 807,935. It will be apparent that inverse but essentially similar effects can be achieved when the fourth semiconductor layer is doped with a donor-type dopant in lieu of the acceptor-type dopant. In this instance, electrons are injected into the active second semiconductor layer to induce a channel of holes similar to the two-dimensional hole gas layer formed in a certain type of high electron mobility transistor.

BRIEF DESCRIPTION OF THE DRAWINGS

The features and advantages of a semiconductor device according to the present invention will be more clearly appreciated from the following description taken in conjunction with the accompanying drawings in which like reference numerals designate similar or corresponding elements, regions and portions and in which.

DESCRIPTION OF THE PREFERRED EMBODIMENTS

Figure 1:
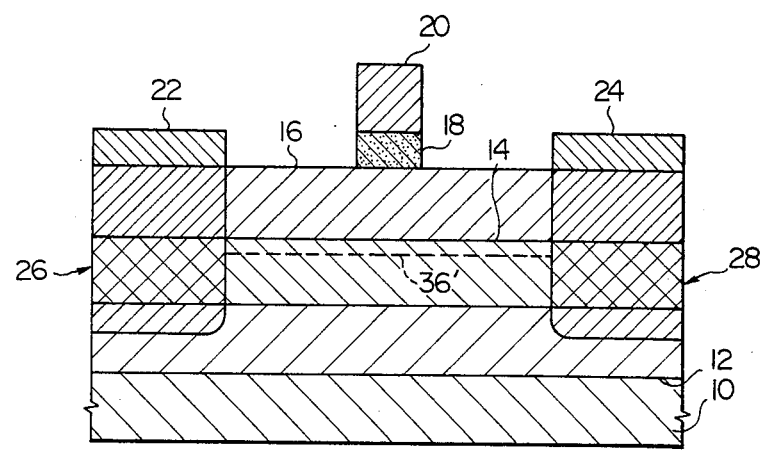
FIG. 1 is a sectional view showing the basic structure of a semiconductor device according to the present invention.

Referring to the drawings, first to FIG. 1, a semiconductor device according to the present invention basically comprises a semi-insulating semiconductor substrate 10, a first semiconductor layer 12 on the substrate 10, a second semiconductor layer 14 on the first semiconductor layer 12, and a third layer 16 on the second semiconductor layer 14. The semi-insulating substrate 10 is typically constructed of monocrystalline GaAs doped with, for example, chromium to be semi-insulating. The first semiconductor layer 12 has a low or substantially zero doping density and is to serve as a buffer layer as will be understood as the description proceeds. The second semiconductor layer 14 has a low or substantially zero doping density and is to serve as an active or current-carrying layer as will also be understood as the description proceeds. The second semiconductor layer 14 is such that the sum of the electron affinity ($X_2$) and energy band gap ($E_{g2}$) thereof is less than the sum of the electron affinity ($X_1$) and energy band gap ($E_{g1}$) of the first semiconductor layer 12 throughout the thicknesses of the layers 12 and 14. The third semiconductor layer 16 has a low or substantially zero doping density and is to serve as a hole transfer layer. The third semiconductor layer 16 is such that the electron affinity ($X_3$) thereof is less than that ($X_2$) of the second semiconductor layer 14 throughout the thicknesses of the layers 14 and 16. Typically, the first semiconductor layer 12 consists of an epitaxial layer of undoped AlGaAs, the second semiconductor layer 14 consists of an epitaxial layer of undoped GaAs, and the third semiconductor layer 16 consists of an epitaxial layer of undoped AlGaAs. Two heterojunction interfaces are thus provided, one between the first and second semiconductor layers 12 and 14 of AlGaAs and GaAs, respectively, and the other between the second and third semiconductor layers 14 and 16 of GaAs and AlGaAs, respectively. Each of the first, second and third semiconductor layers 12, 14 and 16 is assumed, by way of example, as having a compositional profile which is substantially uniform throughout the thickness thereof.

On the third semiconductor layer 16 in turn is formed a patterned fourth layer 18 to serve as a source of holes when activated. The fourth semiconductor layer 18 is heavily doped with, for example, an acceptor-type dopant and is typically an epitaxial layer of AlGaAs doped with beryllium (Be). The $p^+$-type fourth semiconductor layer 18 is covered with a metallized layer 20 of, for example, aluminum (Al) or a gold-zinc (Au-Zn) alloy which forms a control electrode of the shown semiconductor device. Each of the semiconductor layers 12, 14, 16 and 18 is formed typically by molecular beam epitaxy (MBE) growth techniques, although metal-organic chemical vapor deposition (MOCVD) may also be used.

A semiconductor device according to the present invention further comprises metallized layers 22 and 24 which are formed on the third semiconductor layer 16 to provide first and second terminal electrodes for the device. These first and second terminal electrodes 22 and 24 are horizontally spaced apart from each other across the $p^+$-type fourth semiconductor layer 18 and define first and second ohmic contact regions 26 and 28 below the electrodes 22 and 24, respectively, as represented by criss-cross hatched areas in FIG. 1. The ohmic contact regions 26 and 28 extend vertically from the surface of the third semiconductor layer 16 into the first semiconductor layer 12 through the second semiconductor layer 14. The first and second ohmic contact regions 26 and 28 thus defined below the terminal electrodes 22 and 24, respectively, form therebetween vertically aligned active areas in the second and third semiconductor layers 14 and 16. The fourth semiconductor layer 18 covered with the control electrode 20 overlie these acitve areas of the second and third semiconductor layers 14 and 16. During high-temperature steps subsequent to the metallization step, ther terminal electrodes 22 and 24 are alloyed to the AlGaAs and GaAs in the contact regions 26 and 28, which thus provide ohmic contact with the active areas of the semiconductor layers, particularly, the active region of the second semiconductor layer 14. Each of the metallized layers forming the terminal electrodes 22 and 24 consists of, for example, a gold-germanium (Au-Ge) alloy or a gold-germaniumnickel (Au-Ge-Ni) alloy deposited on the surface of the third semiconductor layer 16. The ohmic contact regions 22 and 24 are herein assumed to be left in an "as-grown" state but, if desired, may be heavily doped with a donor-type dopant such as silicon (Si). Though not shown in the drawings, the control electrode 20 may be connected to a source of a suitable bias or control signal voltage. The first terminal electrode 22 may be connected to a ground line and the second terminal electrode 24 may be connected to a suitable constant voltage source.

Figure 2:
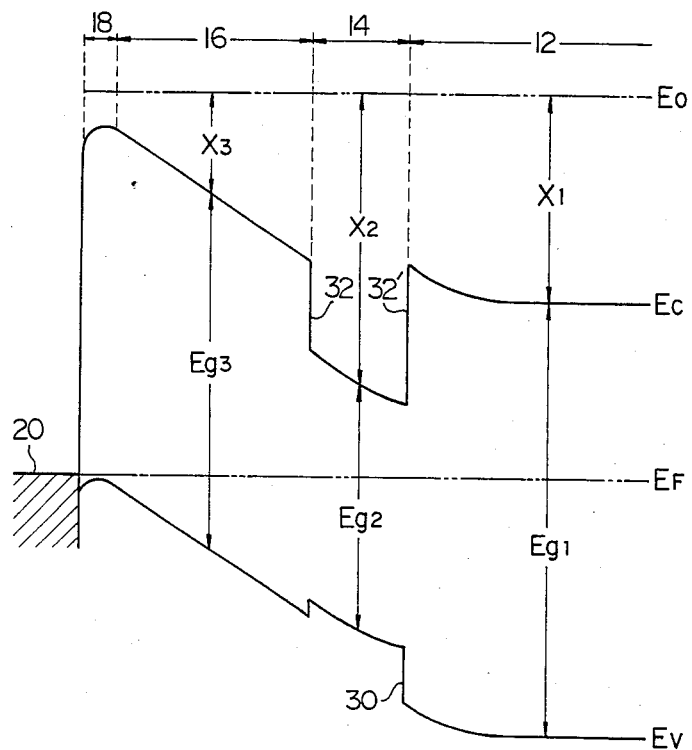
FIG. 2 is an energy band structure diagram for the semiconductor device shown in FIG. 1 in a thermal equilibrium, viz., zero bias state.

FIG. 2 of the drawings is an energy band structure diagram for those areas of the layers 12, 14 and 16 which underlie the control electrode 20 of the device in a thermally equilibrium, viz., zero bias state. Represented by $E_V$ and $E_C$ in FIG. 2 are valence and conduction band edges, respectively, and by $E_F$ and $E_o$ are the Fermi level and the energy level at vacuum, respectively.

When the device is held in a thermal equilibrium state with no bias voltage applied to the control electrode 20, the small band gap layer 14 of undoped GaAs forms generally square potential wells for electrons and holes between the wide band gap layers 12 and 14 of undoped AlGaAs as will be seen from FIG. 2. It will be apparent that the potential well in the valence band is for holes and the potential well in the conduction band is for electrons. The valence band edge $E_V$ has a potential discontinuity which forms a potential barrier 30 to holes at the heterojunction between the first and second semiconductor layers 12 and 14. The conduction band edge $E_C$ has a potential discontinuity which forms a potential barrier 32 to electrons at the heterojunction between the second and third semiconductor layers 14 and 16. The discontinuity in the valence band edge $E_V$ arises from the sum $(X_2+E_{g2})$ of the electron affinity $X_2$ and energy band gap $E_{g2}$ of the second semiconductor layer 14 which is less than the sum $(X_1+E_{g1})$ of the electron affinity $X_1$ and energy band gap $E_{g1}$ of the first semiconductor layer 12. On the other hand, the discontinuity 32 in the conduction band edge $E_C$ results from the electron affinity $X_3$ of the third semiconductor layer 16 being less than that $X_2$ of the second semiconductor layer 14. The potential wells thus formed in the valence and conduction bands provide normally-off or enhancement mode FET characteristics with a built-in depletion region established in the small band gap second semiconductor layer 14 of undoped GaAs in a zero bias state.

Figure 3:
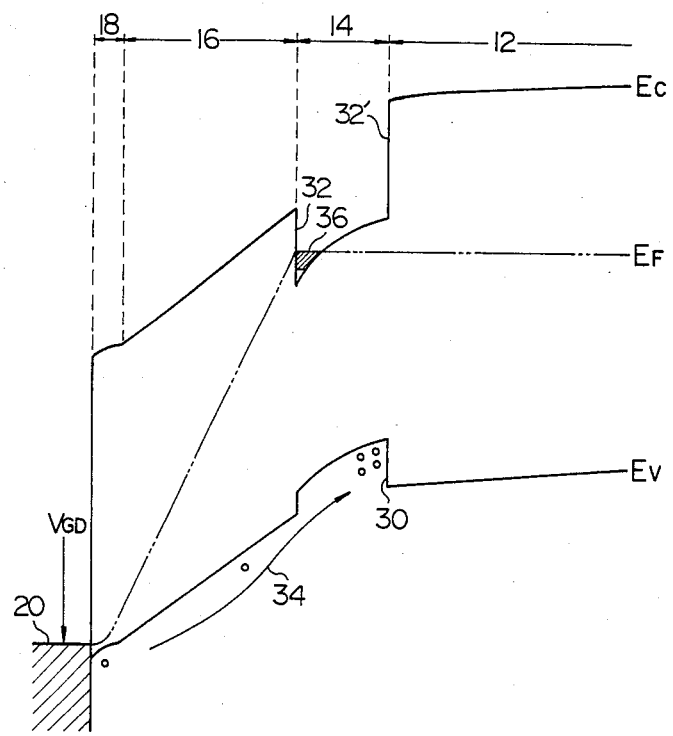
FIG. 3 is an energy band structure diagram for the semiconductor device shown in FIG. 1 as observed when a bias voltage is applied to the control electrode of the device.

FIG. 3 of the drawings shows an energy band structure diagram for the same regions of the layers 12, 14 and 16 as those with the energy band structure shown in FIG. 2 as observed when a positive bias voltage $V_{GD}$ higher than a certain threshold value is applied to the control electrode 20 with the first terminal electrode 22 grounded. By virtue of such a positive bias voltage $V_{GD}$ applied to the control electrode 20, holes (represented by small bubbles below the valence band edge $E_V$) are injected from the fourth semiconductor layer 18 of p+-type AlGaAs into the third semiconductor layer 16 of undoped AlGaAs and are transferred from the layer 16 to the second semiconductor layer 14 of undoped GaAs as indicated by arrow 34 in FIG. 3. The holes thus injected into the second semiconductor layer 14 of undoped GaAs are trapped in the layer 14 due to the potential barrier 30 formed by the discontinuity in the valence band at the heterojunction interface between the layers 12 and 14.

With the holes thus trapped in the second semiconductor layer 14 of undoped GaAs, electrons are induced in the layer 14 in an attempt to neutralize the positive charges of the holes. Due to the initial difference between the electron affinities $X_2$ and $X_3$ of the second and third semiconductor layers 14 and 16, the electrons thus generated in the second semiconductor layer 14 are accumulated in a triangular energy pocket in the conduction band. The electrons thus accumulated are trapped in the second layer 13 due to the potential barrier 32 formed by the discontinuity in the conduction band at the heterojunction interface between the layers 14 and 16. An electron confinement well 36 is accordingly formed at the notch in the conduction band edge $E_C$ adjacent the discontinuity 32 in the band edge as shown in FIG. 3 and forms in the second semiconductor layer 14 a horizontally continuous layer of electrons adjacent the interface between the second and third semiconductor layers 14 and 16. The electrons in the electron confinement well 36 are inhibited from moving in directions normal to this layer of electrons and are allowed to propagate solely along the interface between the semiconductor layers 14 and 16, viz., in two-dimensional directions in the layer 14. A channel region 36' is thus formed immediately underneath the heterojunction interface between the second and third semiconductor layers 14 and 16. This channel region 36' provides a two-dimensional path of electrons through the second semiconductor layer 14 of undoped GaAs and is for this reason analogous to the two-dimensional electron-gas layer formed in an ordinary high-electron-mobility transistor, or HEMT (also known as TEGFET for two-dimensional electron-gas FET).

The electrons forming the channel region 36' in the second semiconductor layer 14 as discussed above are accelerated to drift toward the second ohmic contact region 28 by the field built up between the ohmic contact regions 26 and 28 across the second semiconductor layer 14 with the first terminal electrode 22 connected to ground line. A flow of current is therefore induced between the ohmic contact regions 26 and 28 through the channel region 36' so that additional electrons are supplied to the second semiconductor layer 14 from the region 26 underlying the grounded first terminal electrode 22. As more holes are injected from the fourth semiconductor layer 18 into the second semiconductor layer 14, more electrons are supplied from the contact region 26 into the second semiconductor layer 14 for charge neutrality, attempting to recombine with the holes in the layer 14. The increment in the quantity of the electrons supplied from the contact region 26 to the second semiconductor layer 14 is far larger than the increment in the quantity of the holes injected into the layer 14, thereby providing a current amplification effect. The current thus passed through the channel region 36', viz., the conductance of the channel region 36' can be modulated by varying the quantity of the holes to be injected into the second semiconductor layer 14, viz., the control voltage to be applied to the control electrode 20. The current through the channel region 36' flows at a high velocity between the ohmic contact regions 26 and 28 through the channel region 36'. The high velocity of the current flow results from the high mobility of electrons through the channel region 36' in the second semiconductor layer 14 which is substantially devoid of any impurities that impede movement of electrons.

If a positive voltage is applied to the second terminal electrode 24, there is established a higher field between the ohmic contact regions 26 and 28. Due to the increased field thus built up between the contact regions 26 and 28, the electrons which have entered the channel region 36′ of the second semiconductor layer 14 from the ohmic contact region 26 are enabled to travel through the region 36′ at increased velocities. The electrons injected into the layer 14 are thus enabled to reach the ohmic contact region 28 without recombining with the holes in the layer 14 because of the high velocity of movement of the electrons per se and because of the fact that the holes in the layer 14 tend to stay at the junction between the layers 12 and 14 due to the difference in energy level therebetween. A sufficiently large current thus flows at a high velocity between the ohmic contact regions 26 and 28 through the channel region 36′.

As will be understood from the foregoing description, a semiconductor device according to the present invention has an important aspect that the device functions analogously to an FET device. This because of the fact that the conductance of the channel region 36′ can be modulated by varying the rate at which holes are to be injected into the region 36′ from the layer 18 of doped AlGaAs which thus acts as if it were the gate of an FET. Such a quasi-FET device features a significantly low source resistance with the first and second ohmic contact regions 26 and 28 spaced apart from each other with a depletion region formed therebetween in a thermal equilibrium state. The device further has such a low feedback capacitance between the control electrode 20 and the second terminal electrode 24 that is comparable to its equivalent in a known FET device of, for example, the HEMT type, and a current driving capacity far larger than that which can be achieved by an ordinary FET device.

In the structure shown in FIG. 1, the first semiconductor layer 12 of undoped AlGaAs form a heterojunction at its interface with the second semiconductor layer 14 of undoped GaAs to provide the potential barrier 30 to holes as indicated by the discontinuity of the valence band edge $E_V$ in FIG. 1. Such a potential barrier 30 blocks the possible penetration of holes from the second semiconductor layer 14 into the first semiconductor layer 12 and is thus effective to form a layer of holes accumulated in the second semiconductor layer 14 which forms the potential well for holes between the layers 12 and 14. This layer of the holes accumulated in the second semiconductor layer 14 suppresses the scattering of the electrons in the channel region 36′ in the second semiconductor layer 14 and facilitates trapping of electrons within the triangular electron confinement well 36 shown in FIG. 3. This will improve the two-dimensional mobility performance of electrons in the channel region 36′ and will, accordingly, assure high-velocity transport of electrons through the channel region 36′, providing a low drain conductance and a large current driving capacity. This is one of the outstanding features of a semiconductor device according to the present invention which can not be achieved in a device disclosed in the previously named co-pending U.S. patent application Ser. No. 807,935.

In the structure illustrated in FIG. 1, furthermore, a potential barrier to electrons is also formed by the first and second semiconductor layers 12 and 14 through appropriate selection of the semiconductor bulk materials to form these layers 12 and 14. The semiconductor bulk materials for the first and second semiconductor layers 12 and 14 in the structure shown in FIG. 1 are thus selected so that the electron affinity $X_1$ of the first semiconductor layer 12 is less than the electron affinity $X_2$ of the second semiconductor layer 14, as will be also seen from FIG. 2. In this instance, the band edge $E_C$ of the conduction band has another potential discontinuity on the opposite side of the potential well to the edge discontinuity forming one barrier 32 to electrons. This additional band edge discontinuity forms another potential barrier 32′ to electrons at the heterojunction between the first and second semiconductor layers 12 and 14. The potential barrier 32′ resulting from this discontinuity in the conduction band edge $E_C$ serves to block the transfer of electrons from the second semiconductor layer 14 to the first semiconductor layer 12 and thus assists in trapping electrons within the triangular electron confinement well 36 shown in FIG. 3.

From another point of view, a semiconductor device according to the present invention further has an important aspect that the device is tantamount to a bipolar transistor in that amplification of current can be achieved by the device. Such a current amplification capability of the device results primarily from the difference between the relatively low velocity of the holes injected into the second semiconductor layer 14 and the velocity of the electrons which travel through the channel region 36′ at a substantially saturated velocity. It will thus be understood that a semiconductor device according to the present invention is comparable to an FET device for its simple configuration, fast current flow, and low parasitic resistance and capacitance characteristics and to a bipolar device for its large current driving capacity as well as its current amplification effect.

A semiconductor device according to the present invention is further advantageous for its ability of operating efficiently at both high and low temperatures. The channel region 36′ for transporting electrons is provided in the second semiconductor layer 14 substantially devoid of any impurities which are responsible for the scattering of carriers. The electrons which travel through the channel region 36′ are less likely to scatter at low temperatures which are less responsible for thermal lattice vibration and will therefore provide higher two-dimensional mobility performance at low operating temperatures. At high temperatures, on the other hand, holes can be injected into the second semiconductor layer 14 at a higher efficiency and will thus enable the device to operate more effectively in an FET mode.

A lateral n-i-n GaAs bipolar transistor is known which uses a semi-insulating substrate for the formation of not only an insulation region but also active regions including an insulation region between two n-type regions which act as emitter and collector. Holes are injected into the semi-insulating substrate from the insulation region which thus acts as a virtual base in the substrate. An example of such a device is published by Taira et al, "New Lateral GaAs Transistor", IEDM Tech. Digest 1984-201. A semiconductor device according to the present invention is superior to this type of GaAs bipolar transistor for its high-speed performance and low parasitic resistance and capacitance as achieved by the double heterojunctions and further for its ease of device isolation as provided by the distinct delimitation of the channel region 36′ in the impurity-free second semiconductor layer 14. The most outstanding distinctness of a semiconductor device according to the present invention from the prior-art GaAs bipolar device is however considered to result from the mode of operation of the channel region 36' which acts analogously to the channel in an FET transistor of, particularly, the HEMT type.

While the third semiconductor layer 16 of the structure shown in FIG. 1 has been assumed to consist of undoped AlGaAs, the particular layer 16 may be lightly doped with a donor-type dopant if desired. In this instance, it is important that the layer 16 of the doped AlGaAs be thin enough to provide a normally-off mode so that the carriers which are present in the layer 16, particularly, the region to form the channel region 36' therein in a thermally equilibrium state are negligible in quantity as compared to the holes to be injected into the layer 16. It is further preferable that the carriers which may be present in the second semiconductor layer 14 in a thermally equilibrium state be also negligible in quantity as compared to the holes to be injected into the layer 16.

An additional aspect of a semiconductor device according to the present invention is that the device is operable as an excellent high-frequency oscillator device. Description will be hereinafter made regarding the high-frequency performance of a three-terminal structure semiconductor device according to the present invention. By way of example, the three-terminal structure semiconductor device is assumed to be such that the first semiconductor layer 12 consists of an epitaxial layer of undoped AlGaAs, the second semiconductor layer 14 consists of an epitaxial layer of undoped GaAs, and the third semiconductor layer 16 consists of an epitaxial layer of AlGaAs lightly doped with an n-type dopant such as Si. The patterned fourth layer 18 to serve as the source of holes consists of an epitaxial layer of AlGaAs heavily doped with a p-type dopant such as Be. The second semiconductor layer 14 to serve as the active layer is grown to a relatively small thickness. The use of such a thin epitaxial layer as the second semiconductor layer 14 is not essential for the high-frequency operation of the device but is intended to raise the sub-band energy level which can be assumed by the electrons trapped in the quantum potential well for the purpose of facilitating the high-frequency operation of the device.

Figure 4:
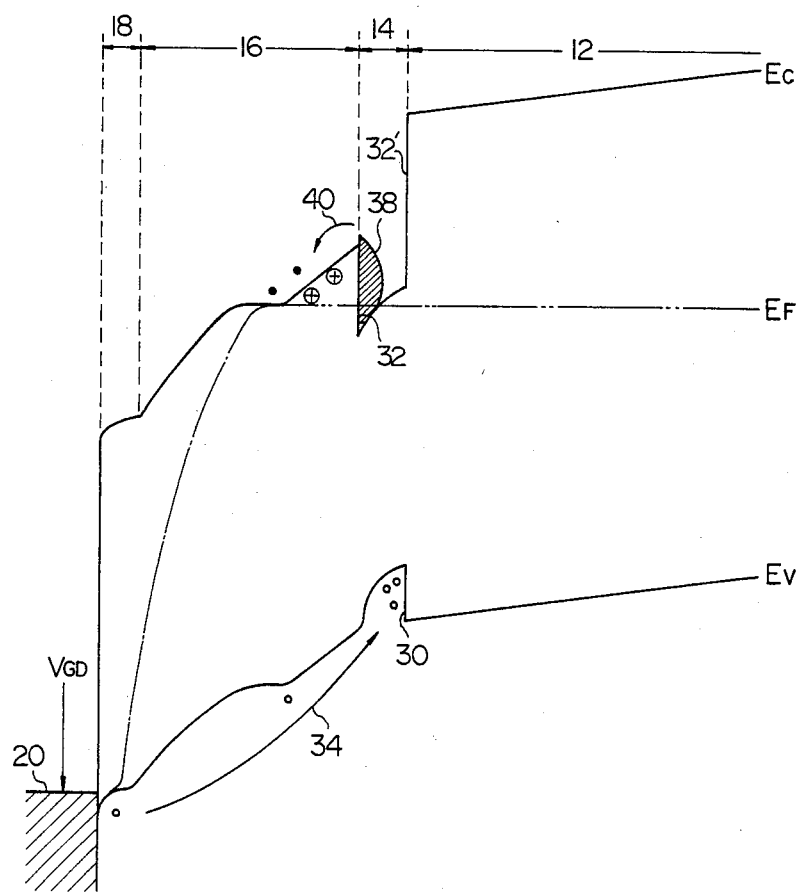
FIG. 4 is an energy band structure diagram for a semiconductor device according to the present invention as observed when the device is used to operate as a high-frequency performance oscillator device.

FIG. 4 of the drawings shows an energy band structure diagram similar to FIG. 2 as observed with a positive voltage applied to the control electrode 20 of the semiconductor device thus constructed. By application of the positive voltage to the control electrode 20, holes are injected from the fourth semiconductor layer 18 of p$^+$-type AlGaAs into the second semiconductor layer 14 of undoped GaAs through the third semiconductor layer 16 of undoped AlGaAs as indicated by arrow 34. Indicated by "x"s enclosed in bubbles in conjunction with the conduction band gap $E_C$ are donor ions generated by the separation of electrons from the donor atoms in the bulk of the third semiconductor layer 16 of n-type doped AlGaAs. A positive voltage being applied to the control electrode 20 of the semiconductor device with the first terminal electrode 22 grounded, the third semiconductor layer 16 has a flat potential level sublayer portion due to the Fermi level which is pinned in proximity to the heterojunction between the layers 14 and 16 holes. The electrons which are increased in quantity with holes injected into the second semiconductor layer 14 occupy the energy level of the energy sub-band formed in the potential well in the conduction band. When a positive voltage is applied to the second terminal electrode 24 under these conditions, the electrons in the channel region 36' of the second semiconductor layer 14 are accelerated by the field built up through the layer 14 and are for this reason distributed in the sub-band with a Bolzmann distribution pattern as indicated by a hatched area 38 in FIG. 4. The electrons in this energy sub-band are partially allowed to surmount the potential barrier 32 at the end of the sub-band and reach the flat potential level sublayer portion of the third semiconductor layer 16 as indicated by arrow 40 in conjunction with the electrons represented by solid dots. The electrons which have thus cleared the potential barrier 32 at the interface between the second and third semiconductor layers 14 and 16 exhibit lower transit performance than that of the electrons in the channel region 36' where ordinary semiconductor bulk materials are used for the second and third semiconductor layers 14 and 16. For this reason, the electrons transferred to the flat potential level sublayer portion of the third semiconductor layer 16 across the potential barrier 32 between the layers 14 and 16 gives rise to a negative dynamic resistance in the current to flow through the channel region 36' and, in this fashion, enable the device to operate with high-frequency characteristics. The principle of operation providing such high-frequency characteristics is per se well known in the art basically as the real space transfer of electrons (Appl. Phys. Lett. 35 (1979), 469).

A semiconductor device according to the present invention is characterized, inter alia in that the quantity of electrons to be active in the channel region 36' is increased by injection of holes into the second semiconductor layer 14 with electrons and holes confined in the layer 14 by the aid of the potential barriers 30 and 32' established by the first semiconductor layer 12. A semiconductor device of this nature is capable of implementing the real space transfer of electrons far more easily than by known semiconductor devices. As a matter of fact, there have been no reports evidencing distinctly observable mode of operation as to known semiconductor devices claimed to have implemented the real space transfer of electrons. This will be primarily because of the limited number of electrons available for the channel region and the inadequate capability of confining electrons in the channel region of a known device.

To achieve the high-frequency mode of operation of a semiconductor device according to the present invention, it is important that the electrons which have been transferred from the second semiconductor layer 14 to the third semiconductor layer 16 be not allowed to reach the control electrode 20 lower in potential level than the layer 16 but be forced to reach the second ohmic contact region 28 by the accelerating field built up across the layer 14. The use of a saliently high voltage for the control electrode 20 is for this reason objectionable and, in order to prevent electrons from propagating from the layer 14 toward the electrode 20, the voltage to be applied to the control electrode 20 should be selected to be optimum for the desired rate at which holes are to be injected into the second semiconductor layer 14.

Figure 5:
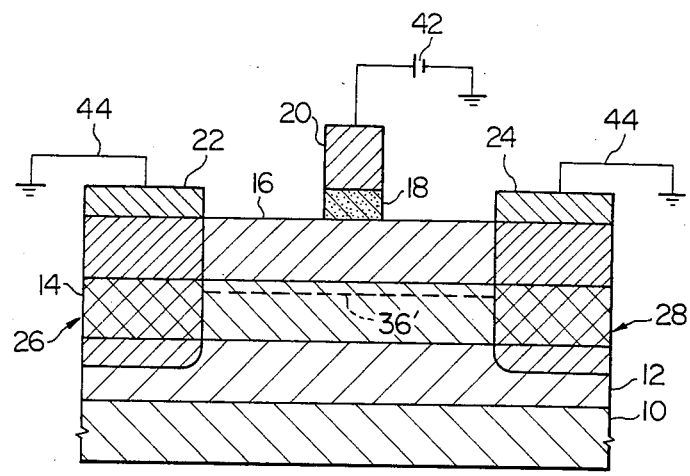
FIG. 5 is a sectional view showing the structure of a semiconductor device according to the present invention as configured to operate as an optoelectronic device.

Another or still additional aspect of a semiconductor device according to the present invention is that the device is operable also as an excellent optoelectronic device. Description will therefore be hereinafter made regarding the optoelectronic performance of the device. FIG. 5 of the drawings shows the construction of an example of such a semiconductor device according to the present invention. The semiconductor device herein shown is assumed to be essentially similar in construction to the structure shown in FIG. 1 and is, thus, such that the first semiconductor layer 12 consists of an epitaxial layer of undoped AlGaAs, the second semiconductor layer 14 consists of an epitaxial layer of undoped GaAs, and the third semiconductor layer 16 consists of an epitaxial layer of undoped AlGaAs. The patterned fourth layer 18 consists of an epitaxial layer of AlGaAs heavily doped with a p-type dopant such as Be. The second semiconductor layer 14 to serve as the active layer is of a relatively small thickness to facilitate recombination of holes and electrons therein. The control electrode 20 is shown connected to a source of a suitable, sufficiently high voltage, while the first and second terminal electrodes 22 and 24 are shown connected to ground lines 44 and 46.

Figure 6:
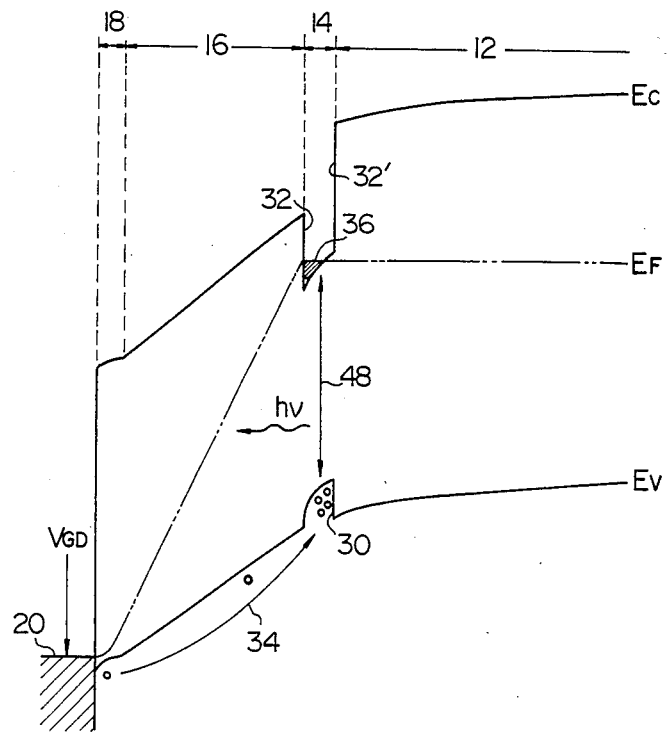
FIG. 6 is an energy band structure diagram for a semiconductor device according to the present invention as observed when the device is used to operate as the optoelectronic device shown in FIG. 5.

FIG. 6 shows an energy band structure diagram similar to FIG. 2 as observed with a positive voltage $V_{GD}$ applied to the control electrode 20 of the semiconductor device thus constructed. With the positive voltage $V_{GD}$ thus applied to the control electrode 20, holes are injected from the fourth semiconductor layer 18 of p+-type AlGaAs into the second semiconductor layer 14 of undoped GaAs through the third semiconductor layer 16 of undoped AlGaAs as indicated by arrow 34. These holes are accumulated in the semiconductor layer 14 which forms the potential well for holes in the valence band of the device as previously discussed. In a device shown in FIG. 5 in which both of the first and second terminal electrodes 22 and 24 are connected to ground, electrons are supplied to the second semiconductor layer 14 from each of these terminal electrodes 22 and 24 and are caused to recombine with the holes which have been accumulated in the layer 14, as symbolically indicated by arrow 48 in FIG. 6. The recombination of the hole-electron pairs across the energy band gap of the small band gap layer 14 results in the efficient emission of photons of energy close to the band gap energy ($E_{g2}$, FIG. 2) of the layer 14. The optical radiation thus achieved is represented by "hv" accompanied by a waving arrow. The device is capable of continuously operating at room temperature since holes and electrons are continuously injected into the small band gap active layer 14. The device is further operable for achieving a long-wave laser action. This is because of the fact that the energy of the photons emitted is strictly less than the band gap energy ($E_{g2}$) of the active layer 14 with the sublayers of holes and electrons accumulated in sublayers slightly spaced apart from each other in the direction of thickness of the layer 14. It will be apparent that, where a semiconductor device according to the present invention is to be utilized as an optoelectronic device as described above, higher radiation outputs will be achieved at higher temperatures which provide higher hole injection efficiencies.

While the first semiconductor layer 12 has been assumed to consist of a single chemical compound such as AlGaAs as has been described, the particular layer may be formed by a superlattice structure which is in effect capable of providing potential barriers to holes and electrons. An example of such a superlattice structure is one with periodically reccurring layers of GaAs and AlGaAs. Furthermore, the third semiconductor layer 16 has been assumed to have a uniform compositional profile throughout the thickness thereof but the layer 16 or at least a sublayer of the layer 16 may, if desired, have a ternary or three-element lattice structure which is compositional profile which is graded from one surface of the layer or sublayer to the other. While, furthermore, the fourth semiconductor layer 18 has been assumed to be doped with a donor-type dopant and used as a hole injector layer, it will be apparent that inverse but essentially similar effects to those achieved as hereinbefore described can be achieved when the fourth semiconductor layer 18 is doped with a donor-type dopant to serve as an electron injection layer with application of a negative voltage thereto. In this instance, electrons are injected into the active second semiconductor layer 14 to induce a channel of holes similar to the two-dimensional hole gas layer formed in a certain type of HEMT.

Description will now be made regarding a few specific embodiments of a semiconductor device according to the present invention having a basic structure shown in FIG. 1.

First Specific Embodiment

Figure 7:
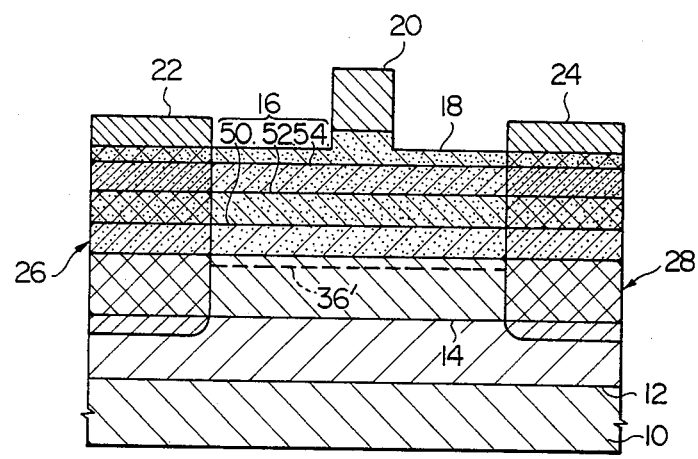
FIG. 7 is a sectional view showing the structure of a specific embodiment of a semiconductor device according to the present invention.

FIG. 7 of the drawings shows one of such specific embodiments of a semiconductor device according to the present invention. In the semiconductor structure herein shown, the first semiconductor layer 12 consists of an epitaxial layer of undoped $Al_{0.4}Ga_{0.6}As$ grown onto the surface of the semi-insulating GaAs substrate 10 to a thickness of 1 um and having a carrier density of $1 \times 10^{14}$ atoms/cm$^3$. The second semiconductor layer 14 consists of an epitaxial layer of p-type GaAs grown onto the surface of the layer 12 to a thickness of 1 um and also having a carrier density of $1 \times 10^{14}$ atoms/cm$^3$. The third semiconductor layer 16 comprises three sublayers which consist of a lower epitaxial layer of n-type $Al_{0.3}Ga_{0.7}As$, an interlevel epitaxial layer 52 of n-type $Al_xGa_{1-x}As$ and an upper epitaxial layer 54 of n-type GaAs. The lower n-type $Al_{0.3}Ga_{0.7}As$ sublayer 50 is grown onto the surface of the layer 14 to a thickness of 100 Angstroms. The interlevel n-type $Al_xGa_{1-x}As$ sublayer 52 is grown onto the surface of the sublayer 50 to a thickness of 150 Angstroms. The upper n-type GaAs sublayer 54 is grown onto the surface of the sublayer 52 a thickness of 50 Angstroms. The n-type $Al_xGa_{1-x}As$ sublayer 52 is compositionally graded with the value of x varying from $Al_{0.3}Ga_{0.7}As$ at the interface with the underlying sublayer 50 to GaAs at the interface with the overlying sublayer 54. Each of the sublayers 50, 52 and 54 thus forming the third semiconductor layer 16 is doped with an n-type dopant such as Si to a doping density of $2 \times 10^{13}$ atoms/cm$^{-3}$. The patterned fourth semiconductor layer 18 consists of an epitaxial layer of p+-type GaAs heavily doped with, for example, Be to a doping density of $3 \times 10^{19}$ atoms/cm$^{-3}$. In the embodiment herein shown, this p+-type GaAs layer 18 covers the total area of the third semiconductor layer 16 and has a thickness of 100 Angstroms under the control electrode 20 and a thickness of 50 Angstroms over the remaining areas.

The control electrode 20 consists of a metallized layer of aluminum deposited on the surface of the thick portion of the p+-type GaAs layer 18. Each of the first and second terminal electrodes 22 and 24 consists of a metallized layer of a gold-germanium-nickel (Au-Ge-Ni) alloy deposited on the surface of the thin portions of the p+-type GaAs layer 18 and alloyed to the underlying layers of GaAs and AlGaAs to form the ohmic contact regions 26 and 28 below the electrodes 22 and 24. The thin additional layer portions forming part of the p+-type GaAs layer 18 serve to provide ease of forming the ohmic contact regions 26 and 28 below the electrodes 22 and 24, respectively, and passivating the device structure. The thin portions of the p+-type GaAs layer 18 are depleted with carriers by the surface potential so that no leakage current will flow through the layer 18. These portions of the toplevel layer 18 also contributes to protection of the surface of the device structure. The n-type doping for the sublayers 50, 52 and 54 forming the third semiconductor layer 16 is also intended to facilitate formation of the ohmic contact regions 26 and 28. Each of the lower and upper sublayers 50 and 54 is thin enough to preclude formation of an electron channel therethrough.

A sample device of the specific embodiment as hereinbefore described was fabricated with the control electrode 20 measuring 0.5 um in length and 200 um in width. When activated to operate in an FET mode, the device showed a high transconductance of 1500 ms/mm at room temperature and 3000 ms/mm at about 60° C. while exhibiting a sufficiently low source resistance and a sufficiently small drain conductance in the current saturation region. When activated to operate in a bipolar mode, on the other hand, the device showed a current amplification factor of 4.0 for a low collector current and 2.0 for a high collector current.

Second Specific Embodiment

A second specific embodiment of a semiconductor device according to the present invention is useful as a high-frequency oscillation transistor and also has a basic structure shown in FIG. 1. The energy band structure diagram of FIG. 4 thus generally applies to this second specific embodiment of a semiconductor device according to the present invention. In this high-frequency device, the first semiconductor layer 12 consists of an epitaxial layer of $Al_{0.3}Ga_{0.7}As$ grown onto the surface of the semi-insulating GaAs substrate 10 to a thickness of 1um and having a carrier density of $1 \times 10^{14}$ atoms/cm$^3$. The second semiconductor layer 14 consists of an epitaxial layer of GaAs grown onto the surface of the layer 12 to a thickness of 300 Angstroms and also having a carrier density of $1 \times 10^{14}$ atoms/cm$^3$. The third semiconductor layer 16 consists of an epitaxial layer of $Al_{0.2}Ga_{0.8}As$ grown onto the surface of the GaAs layer 14 to a thickness of 400 Angstroms and doped to a doping density of $1 \times 10^{13}$ atoms/cm$^3$. The patterned fourth semiconductor layer 18 consists of an epitaxial layer of p+-type GaAs grown onto the surface of the $Al_{0.2}Ga_{0.8}As$ layer 16 to a thickness of 200 Angstroms and heavily doped with, for example, Be to a doping density of $3 \times 10^{19}$ atoms/cm$^{-3}$. The control electrode 20 consists of a metallized layer of aluminum deposited on the surface of the p+-type GaAs layer 18. Each of the first and second terminal electrodes 22 and 24 consists of a metallized layer of a Au-Ge-Ni alloy deposited on the surface of the p+-type GaAs layer 18 and alloyed to the underlying layers of GaAs and AlGaAs to form the ohmic contact regions 26 and 28 below the electrodes 22 and 24. The second semiconductor layer 14 of GaAs is as thin as 300 Angstroms as above noted to facilitate formation of a negative dynamic resistance due to real space transfer of electrons. The reduced proportion of the AlAs constituent in the third semiconductor layer 16 of $Al_{0.2}Ga_{0.8}As$ will contribute to lessening the the potential barrier at the heterojunction between the first and second semiconductor layers 12 and 14. It may be added that it is important to apply a sufficiently high voltage to the control electrode 20 to enable the device to provide the negative dynamic resistance necessary for the device to act as a high-frequency transistor.

Third Specific Embodiment

A third specific embodiment of a semiconductor device according to the present invention is useful as an optoelectronic transistor and is largely similar in construction and arrangement to that illustrated in FIG. 5. The energy band structure diagram of FIG. 6 thus generally applies to this third specific embodiment of a semiconductor device according to the present invention. The device structure of this third specific embodiment is largely similar to the structure of the above described second specific embodiment. In the case of this third specific embodiment, however, the second semiconductor layer 14 is thinned to a thickness of 100 Angstroms as compared to the 300 Angstrom thick layer 14 of the second specific embodiment. Furthermore, the third semiconductor layer 16 in this third specific embodiment consists of an epitaxial layer of undoped $Al_{0.3}Ga_{0.7}As$ grown onto the surface of the GaAs layer 14 to a thickness of 400 Angstroms and having a carrier density of $1 \times 10^{15}$ atoms/cm$^3$. Energy band characteristics as shown in FIG. 6 are achieved with a sufficiently high voltage $V_{GD}$ applied to the control electrode 20 of the device thus constructed. With both of the first and second terminal electrodes 22 and 24 grounded as shown in FIG. 5, the device is capable of emitting photons of an energy level less than the band gap of about 1.4 eV across the active layer 14 of GaAs and is thus operable as an excellent long-wave optoelectronic device.

What is claimed is:

1. A semiconductor device comprising:
   (a) a first semiconductor layer having a low carrier density, a first election affinity, and a first energy band gap,
   (b) a second semiconductor layer formed on said first semiconductor layer and having a low carrier density, a second election affinity, and a second energy band gap, a sum of said second electron affinity and said second energy band gap being smaller than a sum of said first electron affinity and said first energy band gap, a heterojunction being formed between the first and second semiconductor layers,
   (c) a third semiconductor layer formed on said second semiconductor layer and having a third electron affinity smaller than said second electron affinity, a heterojunction being formed between said second and third semiconductor layers,
   (d) a fourth semiconductor layer formed on said third semiconductor layer for injecting carriers of one type into said second semiconductor layer through said third semiconductor layer for inducing a channel of carriers of another type in said second semiconductor layer in proximity to and along an interface between the second and third semiconductor layers,
   (e) a pair of ohmic contact regions extending through said second and third semiconductor layers into said first semiconductor layer for providing ohmic contact at least with said second semiconductor layers,
   (f) a control electrode, provided on said fourth semiconductor layer, for injecting said carriers of said one type into said second semiconductor layer through said fourth semiconductor layer, and (g) means for producing a voltage between said control electrode and at least one of said ohmic contact regions, said carriers of said one type being injected in response to said voltage, wherein conductance between the ohmic contact regions in response to injection of said carriers of said one type from said fourth semiconductor layer into said second semiconductor layer is modulated.

2. A semiconductor device as set forth in claim 1, in which said fourth semiconductor layer is doped with an acceptor-type dopant, and said voltage is sufficient to establish a positive potential between said control electrode and said at least one of said ohmic contact regions, wherein said carriers of said one type are holes and said carriers of said another type are electrons.

3. A semiconductor device as set forth in claim 1, in which said fourth semiconductor layer is doped with a donor-type dopant, and said voltage is sufficient to establish a negative potential between said control electrode and said at least one of said ohmic contact regions, wherein said carriers of said one type are electrons and said carriers of said another types are holes.

4. A semiconductor device as set forth in claim 1, in which said third semiconductor layer has a substantially zero carrier density.

5. A semiconductor device as set forth in claim 1, in which said third semiconductor layer is doped with a donor-type dopant.

6. A semiconductor device as set forth in claim 1, in which said first electron affinity is smaller than said second electron affinity.

7. A semiconductor device as set forth in claim 1, in which each of said first and third semiconductor layers consists of a first type of compound semiconductor material and said second semiconductor consists of a second type of compound semiconductor material.

8. A semiconductor device as set forth in claim 1, in which each of said first and third semiconductor layers consists of aluminum-gallium arsenide and said second semiconductor consists of gallium arsenide 9. A semiconductor device as set forth in claim 1, in which said second semiconductor layer is formed of a first compound semiconductor material and in which said third semiconductor layer comprises a first sublayer formed of a second compound semiconductor material on said second semiconductor layer, a second sublayer formed of a second compound semiconductor material on said first sublayer, and a third sublayer formed of said first compound semiconductor material on said second sublayer.

10. A semiconductor device as set forth in claim 9, in which said second sublayer of said third semiconductor layer consists of a ternary lattice structure which is compositionally graded from the interface between said first and second sublayers to the interface between said second and third sublayers.

11. A semiconductor device as set forth in claim 10, in which said first compound semiconductor material is gallium arsenide and said second compound semiconductor material is aluminum-gallium arsenide and in which said second sublayer is compositionally graded so that the proportion between aluminum gallium arsenide and gallium arsenide varies from the interface between said first and second sublayers to the interface between said second and third sublayers.

* * * * *